United States Patent
Wang

(10) Patent No.: US 7,268,418 B2
(45) Date of Patent: *Sep. 11, 2007

(54) MULTI-CHIPS STACKED PACKAGE

(75) Inventor: Sung-Fei Wang, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/747,128

(22) Filed: Dec. 30, 2003

(65) Prior Publication Data

US 2004/0212096 A1  Oct. 28, 2004

(30) Foreign Application Priority Data

Apr. 23, 2003  (TW)  ............... 92109530 A

(51) Int. Cl.
 H01L 23/02  (2006.01)
 H01L 23/48  (2006.01)
(52) U.S. Cl. ...................... 257/686; 257/777
(58) Field of Classification Search ................ 257/678, 257/676, 738, 698, 777, 787, 723, 778, 686
 See application file for complete search history.

(56) References Cited

U.S. PATENT DOCUMENTS

| | | | |
|---|---|---|---|
| 5,323,060 A | | 6/1994 | Fogal et al. |
| 6,407,456 B1 * | | 6/2002 | Ball ............................ 257/777 |
| 6,503,776 B2 * | | 1/2003 | Pai et al. ..................... 438/106 |
| 6,549,421 B2 * | | 4/2003 | Corisis et al. .............. 361/784 |
| 6,569,709 B2 * | | 5/2003 | Derderian .................... 438/109 |
| 6,607,937 B1 * | | 8/2003 | Corisis ........................ 438/108 |
| 6,642,080 B1 * | | 11/2003 | Ference et al. ............. 438/109 |
| 6,759,737 B2 * | | 7/2004 | Seo et al. .................... 257/686 |
| 6,762,078 B2 * | | 7/2004 | Shin et al. ................... 438/123 |
| 6,803,254 B2 * | | 10/2004 | Park et al. ................... 438/109 |
| 2003/0038374 A1 * | | 2/2003 | Shim et al. .................. 257/777 |

* cited by examiner

*Primary Examiner*—Howard Weiss
*Assistant Examiner*—(Vikki) Hoa B. Trinh
(74) *Attorney, Agent, or Firm*—Bacon & Thomas, PLLC

(57) ABSTRACT

A multi-chips stacked package at least comprises a substrate, a lower chip, an upper chip, an adhesive layer, a supporting body and an encapsulation. The lower chip is disposed on the substrate and the upper chip is attached to the lower chip via the adhesive layer. In addition, the lower chip and the upper chip are electrically connected to the substrate via first electrically conductive wires and second electrically conductive wires respectively. Furthermore, the supporting body is disposed on the lower chip and at the periphery of the upper surface of the lower chip, and covered by the upper chip. The top of the supporting body is apart from the back surface of the upper chip with a distance. Accordingly, when the second electrically conductive wires are bonded the upper chip to the substrate with a larger bonding force to cause the upper chip to be tilted more, the supporting body will support the upper chip and prevent the upper chip from contacting the first electrically conductive wires.

26 Claims, 3 Drawing Sheets

MULTI-CHIPS STACKED PACKAGE

BACKGROUND OF THE INVENTION

1. Field of Invention

This invention relates to a multi-chips stacked package. More particularly, the present invention is related to a multi-chips stacked package with a supporting body for preventing the upper chip from being tilted to damage electrically conductive wires for connecting the lower chip and the substrate.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly packages in miniature and the integrated circuits operation in high frequency, MCM (multi-chips module) packages are commonly used in said assembly package and electronic devices. Usually, said MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, conventional multi-chips module (MCM) packages shall be a multi-chips side-by-side package or a multi-chips stacked package. As shown in FIG. 1, it illustrates a multi-chips stacked package patented in U.S. Pat. No. 5,323,060 to Rich Fogal et al. entitled "Multichip Module Having a Stacked Chip Arrangement" and said stacked package mainly comprises a substrate 110, a lower chip 120 and an upper chip 130. Therein, the upper chip 130 is disposed on the lower chip 120 by wire-bonding and chip-stacking technology, and electrically connected to the substrate 110. Specifically, the U.S. Pat. No. 5,323,060 is characterized in that an adhesive layer 140 is interposed between the lower chip 120 and the upper chip 130 so as to provide a clearance or a gap for wires bonding the lower chip 120 to the substrate 110. Namely, the bonding wires 150 can be accommodated in the clearance. In addition, the thickness of the adhesive layer 140 shall be larger than the distance between the active surface of the upper chip 130 and the loop height of the bonding wires 150 so as to prevent the upper chip 130 from contacting the wires 150. Generally speaking, the adhesive layer 140 is epoxy or tape. However, it is difficult to provide a uniform adhesive layer with an eight (8) mils thickness. It should be noted that when the upper chip 130 is larger than the lower chip 110 in size and the upper chip 130 is electrically connected to the substrate 110 via wires, the upper chip 130 is tilted to cause the wires 150 to be damaged due to larger wire-bonding force and the difficulty in controlling the thickness of the adhesive layer 140. Moreover, it is easy to control the thickness of the adhesive by taking tape with an eight (8) mils thickness. However, the manufacturing cost is higher.

Accordingly, another multi-chips stacked package is provided as shown in FIG. 2. Said package is characterized in that an intermediate chip 160 is interposed between the lower chip 110 and the upper chip 130 through two adhesive layers 162 and 164. The adhesive layers 162 and 164 are made of thermosetting epoxy. Although, the intermediate chip 160 can define a clearance to provide the lower chip 162 enough space for the electrically conductive wires 150 bonding the lower chip 162 to the substrate 110. However, when the electrically conductive wires 164 are bonded the upper chip 130 to the substrate 110 by a larger wire-bonding force, the adhesive layer 164 between the upper chip 130 and the intermediate chip 160 but also the adhesive layer 162 between the lower chip 110 and the intermediate chip 160 will be more difficult to control. Accordingly, the upper chip 130 will be easily tilted so as to cause the electrically conductive wires 150 connecting the lower chip 120 and the substrate 110 to be damaged.

Therefore, providing another assembly package to solve the above-mentioned disadvantages is the most important task in this invention.

SUMMARY OF THE INVENTION

In view of the above-mentioned problems, an objective of this invention is to provide a multi-chips stacked package with a supporting body to prevent the upper chip from being tilted to contact electrically conductive wires for connecting the lower chip and the substrate.

To achieve the above-mentioned objective, a multi-chips stacked package is provided, wherein the multi-chips stacked package mainly comprises a substrate, an upper chip, a lower chip, an interposer, a first adhesive layer, a second adhesive layer, a supporting body and an encapsulation. Therein, the lower chip is disposed on the substrate and electrically connected to the substrate via first electrically conductive wires; the interposer is disposed on the lower chip via the first adhesive layer; the upper chip is disposed on the interposer via the second adhesive layer; and the supporting body is disposed on the substrate and located at the outside of the lower chip so as to have the supporting body covered by the upper chip. Therein, the top of the supporting body is apart from the back surface of the upper chip with a distance and is higher than the top of the arc of the first electrically conductive wires. In such a manner, the upper chip can be prevented from contacting the first electrically conductive wires due to the tilt of the upper chip when the second electrically conductive wires are bonded the upper chip to the substrate. Moreover, the upper chip can also be prevented from being tilted more to have the upper chip being separated from the second adhesive layer.

Next, another multi-chips stacked package is provided, wherein the multi-chips stacked package mainly comprises a substrate, an upper chip, a lower chip, an adhesive layer, a supporting body and an encapsulation. Therein, the lower chip is disposed on the substrate and electrically connected to the substrate via first electrically conductive wires; the upper chip is disposed on the lower chip via the adhesive layer and electrically connected to the substrate via second electrically conductive wires; and the supporting body is disposed on the lower chip and at the periphery of the lower chip so as to have the supporting body covered by the upper chip. Therein, the top of the supporting body is apart from the back surface of the upper chip with a distance. In such a manner, the upper chip can be prevented from being tilted more to have the upper chip being separated from the second adhesive layer when the second wires are bonded the upper chip to the substrate.

In summary, this invention is related to a multi-chips stacked package with a supporting body formed on the substrate or on the lower chip and covered by the upper chip so as to define a distance between the top of the supporting body and the back surface of the upper chip. In such a manner, when the second electrically conductive wires are bonded the upper chip to the substrate with a larger bonding force to cause the upper chip to be tilted more, the supporting body will support the upper chip. Accordingly, the upper chip will be in counterpoise so as to have the wire bonder aligned with the bonding pads on the upper chip more precisely.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The multi-chips stacked package according to the preferred embodiment of this invention will be described herein below with reference to the accompanying drawings, wherein the same reference numbers refer to the same elements.

Figure 1:
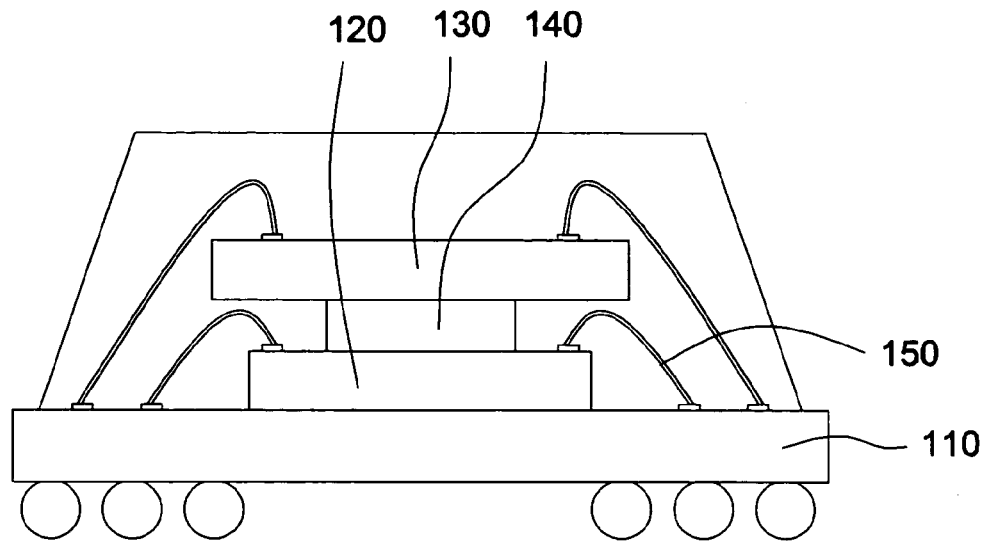
FIG. 1 is a cross-sectional view of the conventional multi-chips stacked package.
Figure 2:
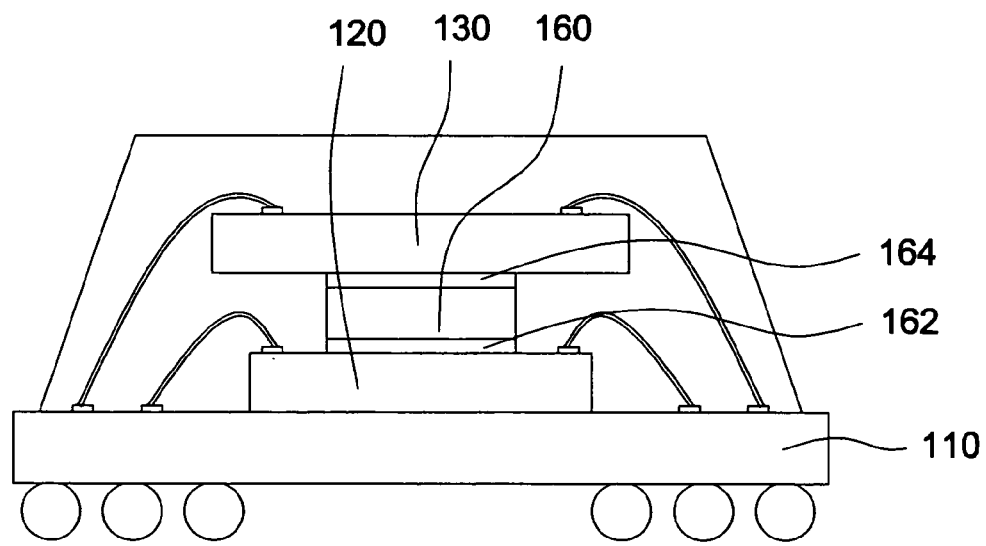
FIG. 2 is a cross-sectional view of another conventional multi-chips stacked package.
Figure 3:
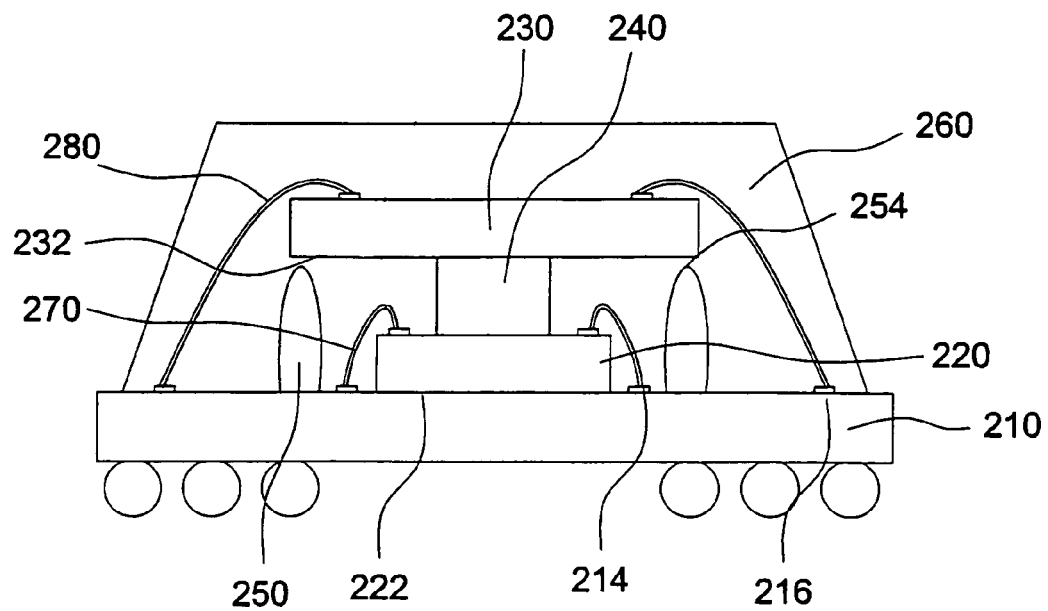
FIG. 3 is a cross-sectional view of a multi-chips stacked package according to the first embodiment.

In accordance with a first preferred embodiment as shown in FIG. 3, there is provided a multi-chips stacked package. The multi-chips stacked package mainly comprises a substrate 210, a lower chip 220, an upper chip 230, an adhesive layer 240, a supporting body 250, and an encapsulation 260. The lower chip 220 has a back surface 222 attached on the substrate 210 and electrically connected to the substrate 210 via a plurality of first electrically conductive wires 270. Moreover, an adhesive layer 240 is interposed between the upper chip 230 and the lower chip 220, and the upper chip 230 is electrically connected to the substrate 210 through a plurality of second electrically conductive wires 280. Besides, the supporting body 250 is disposed on the substrate 210 and located between the first wire-bonding pad 214 and the second wire-bonding pad 216 so as to be covered by the upper chip 230, wherein the first wire-bonding pad 214 connects the first electrically conductive wire 270 and the second wire-bonding pad 216 connects the second electrically conductive wire 280. Therein, the top 254 of the supporting body 250 is apart from the back surface 232 of the upper chip 230 with a distance and is higher than the top of the are of the first electrically conductive wires 270. Accordingly, when the second electrically conductive wires 280 are bonded the upper chip 230 to the substrate 210 with a larger bonding force to cause the upper chip 230 to be tilted more, the supporting body 250 will support the upper chip 230 and prevent the upper chip 230 from contacting the second electrically conductive wires. Moreover, the upper chip 230 can also be prevented from being tilted more and having the upper chip 230 separated from the adhesive layer 240 when the second electrically conductive wires 280 are bonded the upper chip 230 to the substrate 210.

Figure 4:
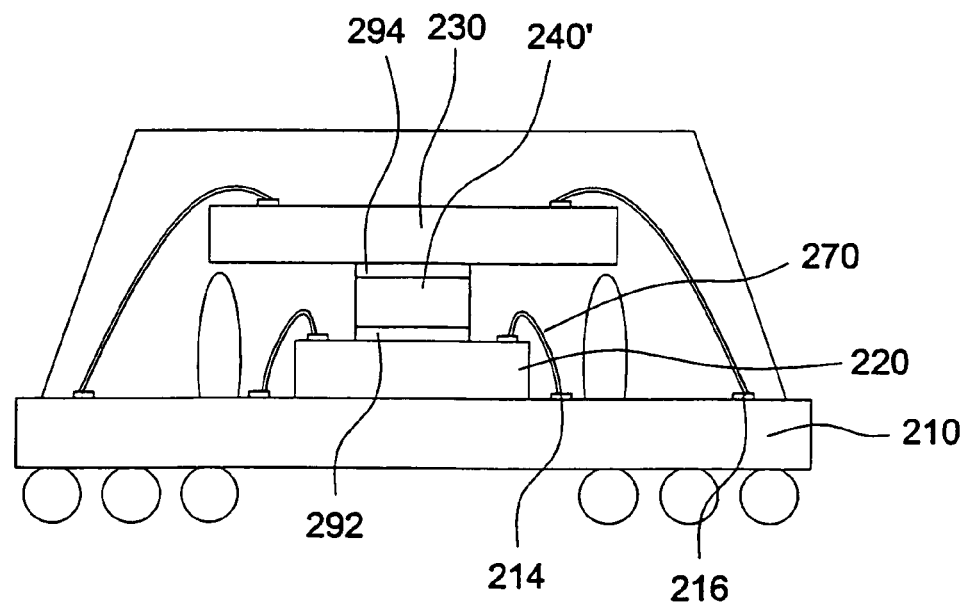
FIG. 4 is a cross-sectional view of a multi-chips stacked package according to the second embodiment.

In addition, as shown in FIG. 4, there is provided another multi-chips stacked package in accordance with the second preferred embodiment of this invention. The difference of the second embodiment from the first one is that there is an interposer 240' provided between the lower chip 220 and the upper chip 230; and there is further provided a first adhesive layer 292 connecting the interpose 240' and a second adhesive layer 294 connecting the interposer 240' and the upper chip 230. Specifically, the interposer 240' may be a dummy chip to define a larger space for accommodating the second electrically conductive wires 270. In such a manner, the upper chip 230 can also be prevented from being tilted more and having the upper chip 230 separated from the second adhesive layer 294 when the second electrically conductive wires 280 are bonded the upper chip 230 to the substrate 210.

As shown above, the supporting body may be made of epoxy, resin or underfill, for example a dam-like epoxy or dam-like underfill. Therein, the dam-like epoxy or dam-like underfill may be disposed on the substrate 210 by the method of dispensing or screen-printing. Specifically, the supporting body 250 may be a bump between the first wire-bonding pad 214 and the second wire-bonding pad 216 or a bar surrounding the lower chip 220. In addition, the supporting body 250 may be a metal bump, for example a solder bump and a gold bump, located on a dummy pad located on the substrate 210. Therein, the solder bump may be formed by the method of screen-printing or plating, and the gold bump may be formed by the method of wire-bonding.

Figure 5:
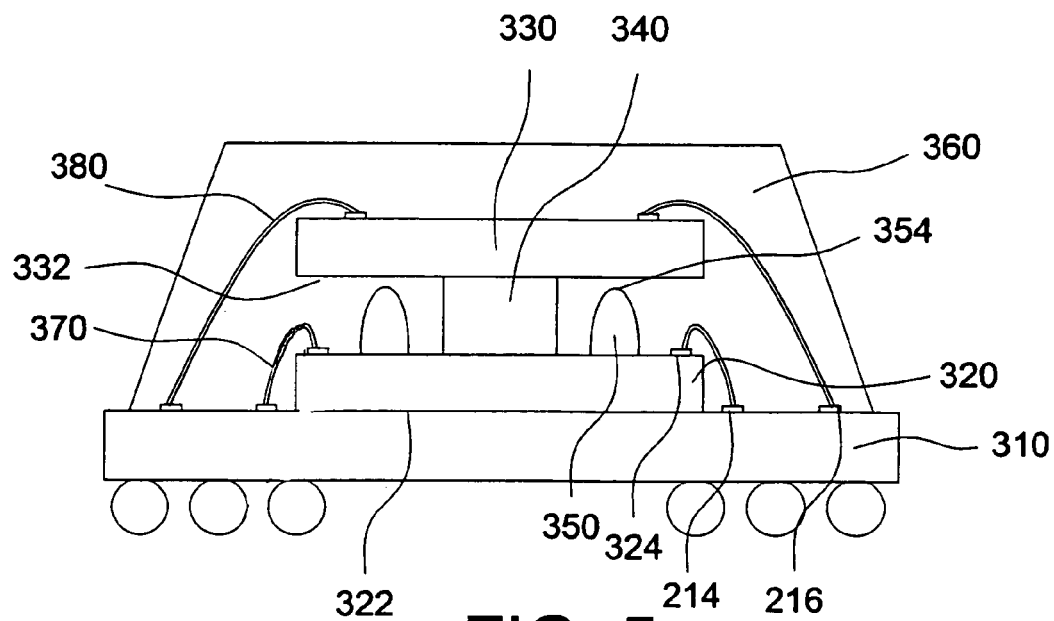
FIG. 5 is a cross-sectional view of a multi-chips stacked package according to the third embodiment.

Next, there is a third embodiment of this invention shown in FIG. 5. Said multi-chips stacked package mainly comprises a substrate 310, a lower chip 320, an upper chip 330, an adhesive layer 340, a supporting body 350, and an encapsulation 360. The lower chip 320 has a back surface 322 attached on the substrate 310 and electrically connected to the substrate 310 via a plurality of first electrically conductive wires 370. Moreover, an adhesive layer 340 is interposed between the lower chip 320 and the upper chip 330 and the upper chip 330 is electrically connected to the substrate 310 through a plurality of second electrically conductive wires 380. Besides, the supporting body 350 is disposed on the lower chip 320 and located between the adhesive layer 340 and the bonding pad 324 connecting to the wire-bonding pad 314 and so as to be covered by the upper chip 230 and disposed at the periphery of the lower chip. Therein, the top 354 of the supporting body 350 is apart from the back surface 332 of the upper chip 330 with a distance and is higher than the top of the are of the first electrically conductive wires 370. Accordingly, when the second electrically conductive wires 380 are bonded the upper chip 330 to the substrate 310 with a larger bonding force to cause the upper chip 330 to be tilted more, the supporting body 350 will support the upper chip 330 and prevent the upper chip 330 from contacting the first electrically conductive wires. Moreover, the upper chip 330 can also be prevented from being tilted more and having the upper chip 330 separated from the adhesive layer 340 when the second electrically conductive wires 380 are bonded the upper chip 330 to the substrate 310.

Figure 6:
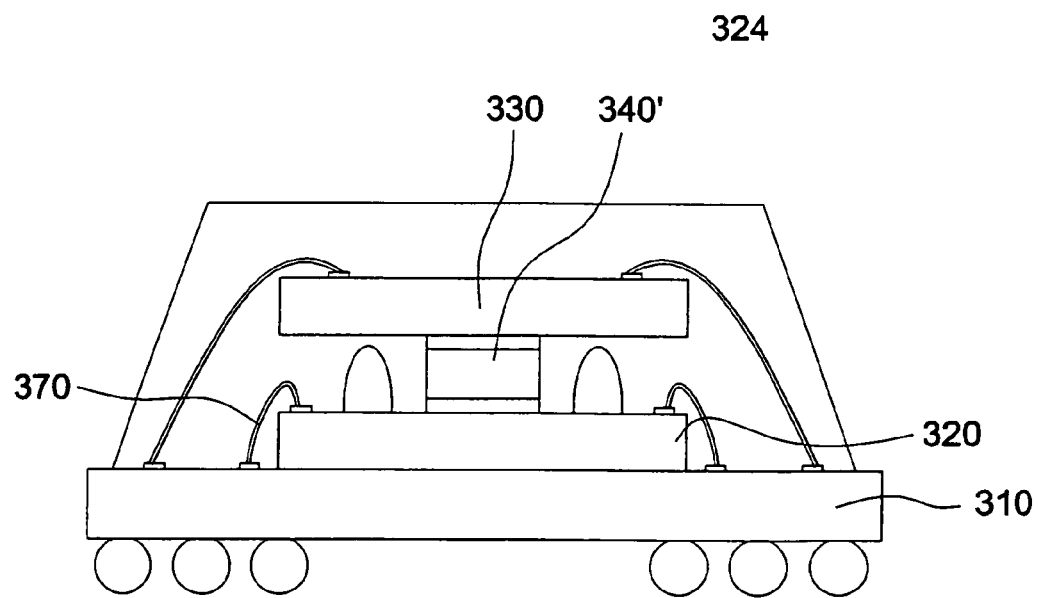
FIG. 6 is a cross-sectional view of a multi-chips stacked package according to the fourth embodiment.

In addition, as shown in FIG. 6, there is provided another multi-chips stacked package in accordance with the fourth preferred embodiment of this invention. The difference of the fourth embodiment from the third one is that there is an interposer provided between the upper chip 330 and the lower chip 320; and there is further provided a first adhesive layer 392 connecting the interpose 340' and the lower chip 320, and a second adhesive layer 394 connecting the interposer 340' and the upper chip 230. Specifically, the interposer 340' may be a dummy chip to define a larger space for accommodating the second electrically conductive wires 370. In such a manner, the upper chip 330 can also be prevented from being tilted more, when the second electrically conductive wires 380 are bonded the upper chip 330 to the substrate 310.

Although the invention has been described in considerable detail with reference to certain preferred embodiments, it will be appreciated and understood that various changes and modifications may be made without departing from the spirit and scope of the invention as defined in the appended claims.

What is claimed is:

1. A multi-chips stacked package, comprising:
   a substrate having an upper surface;
   a lower chip having a first active surface and a first back surface, wherein the lower chip is disposed above the upper surface of the substrate and electrically connected to the substrate via a plurality of first electrically conductive wires;
   an interposer disposed on the first active surface of the lower chip;
   an upper chip having a second active surface and a second back surface, wherein the upper chip is disposed above the interposer and electrically connected to the substrate via a plurality of second electrically conductive wires; and
   a supporting body disposed on the upper surface of the substrate and covered by the upper chip,
   wherein the top of the supporting body is higher than the top of the arc of each of the first electrically conductive wires and lower than the second back surface of the upper chip, and the second back surface of the upper chip is attached to the interposer, and
   wherein an encapsulation is disposed between one of the top of the supporting body and the second back surface of the upper chip.

2. The multi-chips stacked package of claim 1, wherein the substrate has a first wire-bonding pad formed on the upper surface and the first wire-bonding pad is connected to the first electrically conductive wire.

3. The multi-chips stacked package of claim 2, wherein the supporting body is located between the first wire-bonding pad and a second wire-bonding pad formed on the upper surface and connected to the second electrically conductive wire.

4. The multi-chips stacked package of claim 1, wherein the supporting body surrounds the lower chip.

5. The multi-chips stacked package of claim 1, wherein the supporting body is made of epoxy.

6. The multi-chips stacked package of claim 1, wherein the supporting body is a metal bump.

7. The multi-chips stacked package of claim 1, wherein the upper chip is larger than the lower chip in size.

8. The multi-chips stacked package of claim 1, further comprising a first adhesive layer interposed between the lower chip and the interposer.

9. A multi-chips stacked package, comprising:
   a substrate having an upper surface;
   a lower chip having a first active surface and a first back surface, wherein the lower chip is disposed on the upper surface of the substrate and electrically connected to the substrate via a plurality of first electrically conductive wires;
   an interposer disposed above the first active surface of the lower chip;
   an upper chip having a second active surface and a second back surface, wherein the upper chip is disposed above the interposer and electrically connected to the substrate via a plurality of second electrically conductive wires; and
   a supporting body disposed on the lower chip and covered by the upper chip,
   wherein the top of the supporting body is lower than the second back surface of the upper chip, and the second back surface is attached to the interposer, and
   wherein an encapsulation is disposed between one of the top of the supporting body and the second back surface of the upper chip.

10. The multi-chips stacked package of claim 9, wherein the upper chip is larger than the lower chip in size.

11. The multi-chips stacked package of claim 9, wherein the supporting body is located at the periphery of the lower chip.

12. The multi-chips stacked package of claim 9, wherein the supporting body surrounds the interposer.

13. The multi-chips stacked package of claim 9, wherein the supporting body is made of epoxy.

14. The multi-chips stacked package of claim 9, wherein the supporting body is a metal bump.

15. The multi-chips stacked package of claim 9, wherein the interposer is a dummy chip.

16. The multi-chips stacked package of claim 9, wherein a first adhesive layer is disposed between the lower chip and the interposer.

17. The multi-chips stacked package of claim 9, wherein a second adhesive layer is disposed between the upper chip and the interposer.

18. The multi-chips stacked package of claim 9, wherein the interposer is an adhesive layer.

19. The multi-chips stacked package of claim 9, wherein the lower chip has a bonding pad formed on the first active surface of the lower chip , and connected to the first wire, and the supporting body is located between the interposer and the bonding pad.

20. A multi-chips stacked package, comprising:
   a substrate having an upper surface;
   a lower chip having a first active surface and a first back surface, wherein the lower chip is disposed on the upper surface of the substrate and electrically connected to the substrate via a plurality of first electrically conductive wires;
   an interposer disposed on the first active surface of the lower chip;
   an upper chip having a second active surface and a second back surface, wherein the upper chip is disposed above the interposer and electrically connected to the substrate via a plurality of second electrically conductive wires; and
   a supporting body disposed on the upper surface of the substrate and covered by the upper chip, wherein the top of the supporting body is higher than the top of the are of each of the first electrically conductive wires and lower than the second back surface of the upper chips and the second back surface is attached to the interposer, and wherein an encapsulation is disposed between one of the top of the supporting body and the second back surface of the upper chip.

21. A multi-chips stacked package, comprising:
a substrate having an upper surface;
a lower chip having a first active surface, a first back surface, and a bonding pad, wherein the lower chip is disposed on the upper surface of the substrate and electrically connected to the substrate via a plurality of first electrically conductive wires, and the bonding pad is formed on the first active surface of the lower chip and connected to the first electrically conductive wire;
an interposer disposed above the first active surface of the lower chip;
an upper chip having a second active surface and a second back surface, wherein the upper chip is disposed above the interposer and electrically connected to the substrate via a plurality of second electrically conductive wires; and
a supporting body disposed on the lower chip and covered by the upper chip, wherein the supporting body is located between the interposer and the bonding pad, and
wherein the top of the supporting body is lower than the second back surface of the upper chip, and the second back surface is attached to the interposer.

22. The multi-chips stacked package of claim 21, wherein the upper chip is larger than the lower chip in size.

23. The multi-chips stacked package of claim 21, wherein the supporting body is located at the periphery of the lower chip.

24. The multi-chips stacked package of claim 21, wherein the supporting body surrounds the interposer.

25. The multi-chips stacked package of claim 21, wherein the supporting body is made of epoxy.

26. The multi-chips stacked package of claim 21, wherein the supporting body is a metal bump.

* * * * *